(12) United States Patent
Burke et al.

(10) Patent No.: US 7,809,521 B1
(45) Date of Patent: Oct. 5, 2010

(54) PRECISE DELAY MEASUREMENT THROUGH COMBINATORIAL LOGIC

(75) Inventors: Gary R. Burke, Moorpark, CA (US); Yuan Chen, Glendale, CA (US); Douglas J. Sheldon, Valencia, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 337 days.

(21) Appl. No.: 12/040,459

(22) Filed: Feb. 29, 2008

(51) Int. Cl.
*H03K 19/00* (2006.01)
*G06F 17/00* (2006.01)

(52) U.S. Cl. ............... 702/125; 702/117; 702/118; 702/79; 326/16

(58) Field of Classification Search ........... 702/125, 702/78, 79, 117, 118
See application file for complete search history.

(56) References Cited

U.S. PATENT DOCUMENTS

| | | | | |
|---|---|---|---|---|
| 5,631,596 | A * | 5/1997 | Sporck et al. | 327/378 |
| 5,822,228 | A * | 10/1998 | Irrinki et al. | 714/718 |
| 5,923,676 | A * | 7/1999 | Sunter et al. | 714/733 |
| 6,075,418 | A | 6/2000 | Kingsley et al. | |
| 6,081,473 | A * | 6/2000 | Agrawal et al. | 365/230.01 |
| 6,466,520 | B1 * | 10/2002 | Speyer et al. | 368/118 |
| 6,538,465 | B1 * | 3/2003 | Demone | 326/29 |
| 6,983,394 | B1 | 1/2006 | Morrison et al. | |
| 7,256,610 | B1 * | 8/2007 | Balasubramanian et al. | 326/38 |
| 2003/0098731 | A1 | 5/2003 | Tabatabaei et al. | |
| 2005/0149777 | A1 * | 7/2005 | Yuan et al. | 714/700 |

OTHER PUBLICATIONS

Mattia Ruffoni et al., "Direct Measures of Path Delays on Commercial FPGA Chips", 6th IEE Workshop on. Proceedings volume Issue . 2002 pp. 157-159.
Santos A, CMOS delay locked and sub-nanosecond time-to-digital converter chip, IEEE Trans on Nuclear Science, vol. 43, pp. 1717-1719, Jun. 1996.
Abramovici M. and Stroud C. , "BIST-based delay-fault testing in FPGAs," Journal of Electronic Testing, vol. 19, No. 5, pp. 549-558, Oct. 2003.
Premachandran R. et al.. Design-Specific Path Delay Testing in Lookup Table-based FPGAs, Transactions on Computer-Aided Design of Integrated Circuits . . . , vol. XX, No. Y (2005).
Chmelar E. "FPGA interconnect delay fault testing," in IEEE Int. Test Conf., Charlotte, NC, Sep. 2003, pp. 1239-1247.
Tahoori M. and Miltra S., "Interconnect delay testing of designs on programmable logic devices," in IEEE Int. Test Conf., Charlotte, NC, Oct. 2004.

* cited by examiner

*Primary Examiner*—Hal D Wachsman
(74) *Attorney, Agent, or Firm*—Mark Homer

(57) ABSTRACT

A high resolution circuit and method for facilitating precise measurement of on-chip delays for FPGAs for reliability studies. The circuit embeds a pulse generator on an FPGA chip having one or more groups of LUTS (the "LUT delay chain"), also on-chip. The circuit also embeds a pulse width measurement circuit on-chip, and measures the duration of the generated pulse through the delay chain. The pulse width of the output pulse represents the delay through the delay chain without any I/O delay. The pulse width measurement circuit uses an additional asynchronous clock autonomous from the main clock and the FPGA propagation delay can be displayed on a hex display continuously for testing purposes.

14 Claims, 3 Drawing Sheets

PRECISE DELAY MEASUREMENT THROUGH COMBINATORIAL LOGIC

STATEMENT OF GOVERNMENT INTEREST

The invention described hereunder was made in the performance of work under a NASA contract, and is subject to the provisions of Public Law #96-517 (35 U.S.C. 202) in which the Contractor has elected not to retain title.

BACKGROUND OF THE INVENTION

1. Field of the Invention

The present invention relates to digital electronic circuits and, more particularly, to a method and system for measuring on-chip delays for Field Programmable Gate Arrays (FPGAs) for reliability testing.

2. Description of Prior Art

A Field Programmable Gate Array or FPGA is a semiconductor device containing programmable logic components that can be programmed to duplicate the functionality of basic logic gates such as AND, OR, XOR, NOT or more complex combinatorial functions such as decoders or simple math functions. The FPGA also contains sequential logic in the form of configurable flip/flops. Many FPGAs also include memory elements such as RAMs.

An FPGA typically includes an array of configurable logic blocks (CLBs) surrounded by a ring of programmable input/output blocks (IOBs). The CLBs and IOBs are interconnected by a programmable interconnect structure. The CLBs typically include several "lookup tables" (LUTs). A LUT is an addressable memory array that is typically loaded with data during the configuration process. For example, some commercial CLBs includes eight LUTS and eight flip/flops. Each LUT has four data input terminals that address the configurable memory. By storing predetermined values in the appropriate memory locations, the LUT can be configured to provide any function of up to four variables. Indeed, all of the CLBs, IOBs, and interconnect structure are typically programmed by loading a stream of configuration data (bitstream) into internal configuration memory that define how the CLBs, IOBs, and interconnect structure are configured. The collective states of the individual memory determine the function of the FPGA. As the size and complexity of FPGAs grow, manufactures are becoming more concerned with measuring the speed and performance of their designs.

FIG. 1 depicts a conventional test configuration 100 for determining the signal propagation delay of a test circuit 110 in a conventional IC 115. A tester 120 includes an output lead 125 connected to an input pin 130 of IC 115. Tester 120 also includes an input line 135 connected to an output pin 140 of IC 115. Tester 120 applies an input signal to input pin 130 and measures how long the signal takes to propagate through test circuit 110 from input pin 130 to output pin 140. The resulting time period is the timing parameter for test circuit 110, the path of interest.

The above-noted test procedure is problematic with FPGAs because many of the signal paths internal to the chip are not accessible via input and output pins, and therefore cannot be measured directly.

Other techniques have been developed to measure signal propagation delays in FPGAs.

Traditionally, a delay chain of inverters is placed on the FPGA, with an input port feeding the inverter chain and an output port driving the output of the chain off-chip. Unfortunately, this is inaccurate since the input and output delays are included.

Another method arranges the delay chain as a ring oscillator. For example, U.S. Pat. No. 6,075,418 to Kingsley, et al., entitled "System With Downstream Set or Clear for Measuring Signal Propagation Delays on Integrated Circuits," issued Jun. 13, 2000, describes methods of measuring signal-propagation delays by including signal paths of interest in ring oscillators. The ring oscillators oscillate at frequencies that area function of the delays through signal paths of interest. The oscillation frequencies of such oscillators are therefore indicative of the delays through various paths of interest.

See, also, Direct Measures of Path Delays on Commercial FPGA Chips" by Mania Ruffoni et al., $6^{th}$ IEE Workshop, Proceedings volume issue, 2002, pages 157-159, which suggests a comparison between the operating frequency of a ring oscillator that includes the path under test, and that of a reference ring oscillator that does not. The ring oscillator approach suffers from the problem that it does not always oscillate as expected.

United States Patent Application 20030098731 by Tabatabaei, Sassan et al. published May 29, 2003 shows a high resolution time-to-digital converter (TDC) that uses a pair of digital oscillators. The periods of the oscillators differ. The oscillators are triggered by START and STOP pulses. A counter counts a number of pulses until reference points on the signals output by the oscillators coincide. Measurements may be made using a dual resolution method. Intrinsic jitter of the TDC can be determined by comparing sets of measurements in which the switch in resolutions is made at different points. A range extender circuit may be provided to extend a valid measurement range of the TDC.

U.S. Pat. No. 6,983,394 to Morrison et al. (Xilinx) issued Jan. 3, 2006 shows a method and apparatus for clock signal performance measurement using a digital delay in conjunction with a processing circuit to continuously measure the jitter of an input clock signal. A pair of digital delay circuits is used to continuously measure the skew or delay between a reference clock signal and a input clock signal, thus providing a measurement of the skew of the input clock signal over time. The digital delay circuit(s) are formed on-chip, and thus an on-chip determination of jitter or skew may be provided.

Santos, A CMOS delay locked and sub-nanosecond time-to-digital converter chip, IEEE Trans on Nuclear Science, vol. 43, pp. 1717-1719, June, 1996 discloses a TDC based on the use of a delay chain. In this circuit, the output of the delay elements in the delay chain are set HIGH as the START rising edge travels through them. A delay locked loop (DLL) is used to calibrate the delay elements to a known delay. Such a calibration requires very good matching between all the delay elements in both the delay chain and the DLL.

M. Abramovici and C. Stroud, "BIST-based delay-fault testing in FPGAs," Journal of Electronic Testing, vol. 19, no. 5, pp. 549-558, October 2003 discloses a comparison-based delay test method in which a number of identical paths are constructed in the FPGA under test and every LUT on these paths is programmed to propagate an input value to its output. A fault is detected when the difference between the arrival times at the destinations of the first and last signals exceeds a specified threshold.

Design-Specific Path Delay Testing in Lookup Table-based FPGAs, Premachandran R. Menoh et al., Transactions On Computer-Aided Design Of Integrated Cirtuits And Systems, Vol. XX, No. Y (2005) shows an approach for FPGA path delay testing which partitions target paths into subsets that are tested in the same test configuration. Each path is tested for all combinations of signal inversions along the path length. Each configuration consists of a sequence generator, response analyzer and circuitry for controlling inversions along tested paths, all of which are formed from FPGA resources not currently under test.

E. Chmelar, "FPGA interconnect delay fault testing," in IEEE Int. Test Conf., Charlotte, N.C., September 2003, pp. 1239-1247 is a similar comparison-based delay approach to the Abramovici article.

M. Tahoori and S. Mitra, "Interconnect delay testing of designs on programmable logic devices," in IEEE Int. Test Conf., Charlotte, N.C., October 2004 disclose a method of testing all paths in a combinational network for delay faults in which all paths are simultaneously tested for slow-to-rise faults by applying 0->1 transitions at all inputs. Slow-to-fall faults are similarly tested by changing LUT functions to ORs and applying 1->0 transitions at all inputs.

It would be greatly advantageous to provide an improved circuit architecture and method for built-in self-test (BIST) of FPGA propagation delay using available (unused) FPGA resources, that provides an actual and very precise measurement of the propagation delay through the delay chain-without any input and output delays.

SUMMARY OF THE INVENTION

It is a primary object of this invention to provide a built-in self-test (BIST) for FPGA propagation delay by configuring unused FPGA resources.

It is another object to provide a BIST test architecture configured from unused FPGA resources, and a method of testing propagation delays through the FPGA LUTs that eliminates input and output delays.

It is a more specific object to provide a built-in self-test (BIST) for FPGA propagation delay that embeds a pulse generator on the FPGA chip for propagating a pulse train through groupings of LUTs, and a pulse width measurement circuit (likewise on-chip) to measure the pulse width of the generated pulse through the delay chain, the pulse width representing the delay through the delay chain without any I/O delays, so that a determination of the propagation delay can be made very accurately.

It is still another object to provide a BIST architecture and test method as described above that uses an additional asynchronous clock autonomous from a main clock to increase the accuracy of the measurement of propagation delay.

In accordance with the foregoing objects, the present invention is a circuit that facilitates precise measurement of on-chip delays for FPGAs for reliability studies. The circuit incorporates an on-chip pulse generator, and on-chip pulse measurement circuitry programmed into a conventional semiconductor FPGA device to act as a performance monitor to measure the duration of a generated pulse through one or more groups of LUTS (the "LUT delay chain") which are also on-chip.

A multiplexer multiplexes the pulse train Output from the groupings of LUTs, and a logic gate compares the multiplexer output with the input pulse train (all also on-chip). The pulse width measurement circuit measures the pulse width of the generated pulse through the delay chain, the pulse width representing the delay through the delay chain without any I/O delays, so that a determination of the propagation delay can be made very accurately.

Given the present architecture the I/O delays are no longer significant and the delay measurements can be made very accurately.

Moreover, the pulse width measurement circuit uses an additional asynchronous clock autonomous from a main clock to increase the accuracy of the measurement of propagation delay. The additional clock is not synchronized to the main clock and this vastly improves the sampling rate and resulting accuracy. The pulses are sampled and converted to an error value using state machines, counters and lookup tables. The result is displayed on an external multidigit hex display continuously.

BRIEF DESCRIPTION OF THE DRAWINGS

Other objects, features, and advantages of the present invention will become more apparent from the following detailed description of the preferred embodiments and certain modifications thereof when taken together with the accompanying drawings in which.

DETAILED DESCRIPTION OF THE PREFERRED EMBODIMENTS

The present invention is a BIST test architecture and method for precise measurement of on-chip delays for FPGAs to be used in reliability studies. The architecture incorporates an on-chip pulse generator and on-chip pulse measurement circuitry to measure the duration of a generated pulse through one or more groups of LUTS (the "LUT delay chain") also on-chip. The measured pulse width represents the delay through the LUT delay chain under test. Since the pulse is generated on-chip there are no significant I/O delays, and the delay measurements can be made very accurately. The on-chip pulse width measurement circuit uses an additional asynchronous clock autonomous from a main clock to greatly improve the sampling rate and resulting accuracy. The on-chip pulse measurement circuitry is configured to measure the pulse width of the output pulse, which is then converted to a hex value using state machines, counters and lookup tables. The result is displayed on a multidigit hex display continuously.

Figure 1:
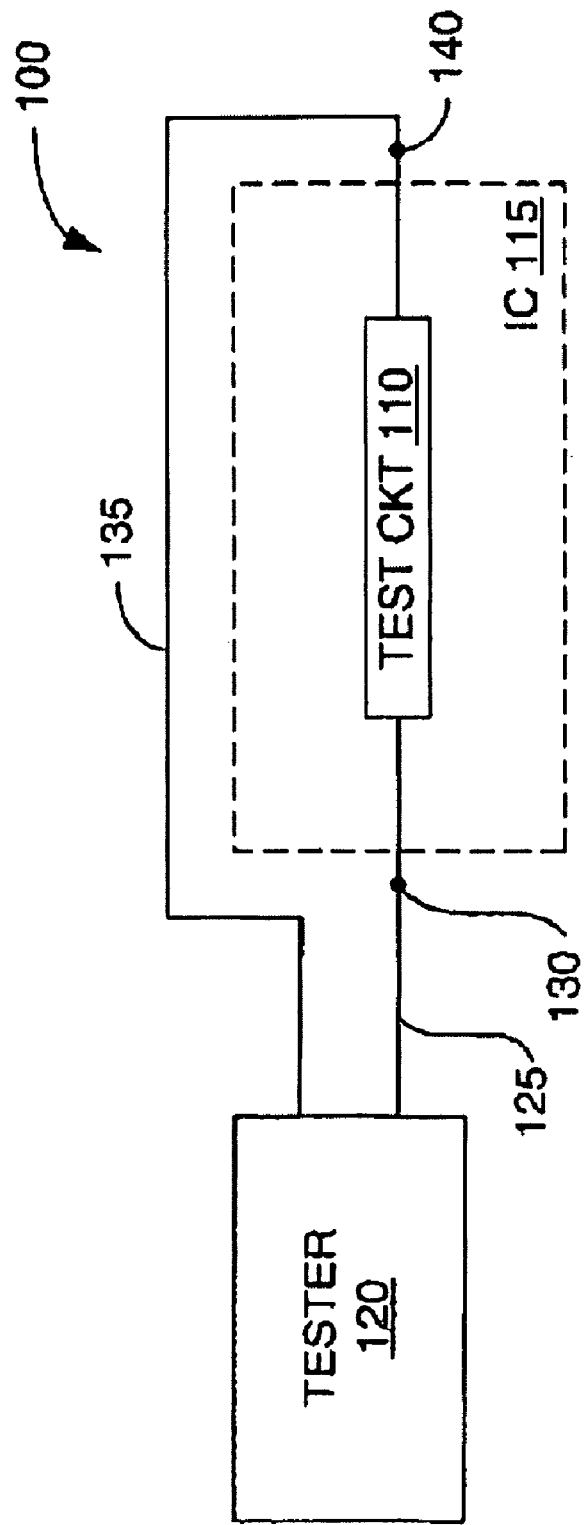
FIG. 1 depicts a conventional test configuration for determining the signal propagation delay of a test circuit in a conventional IC.
Figure 2:
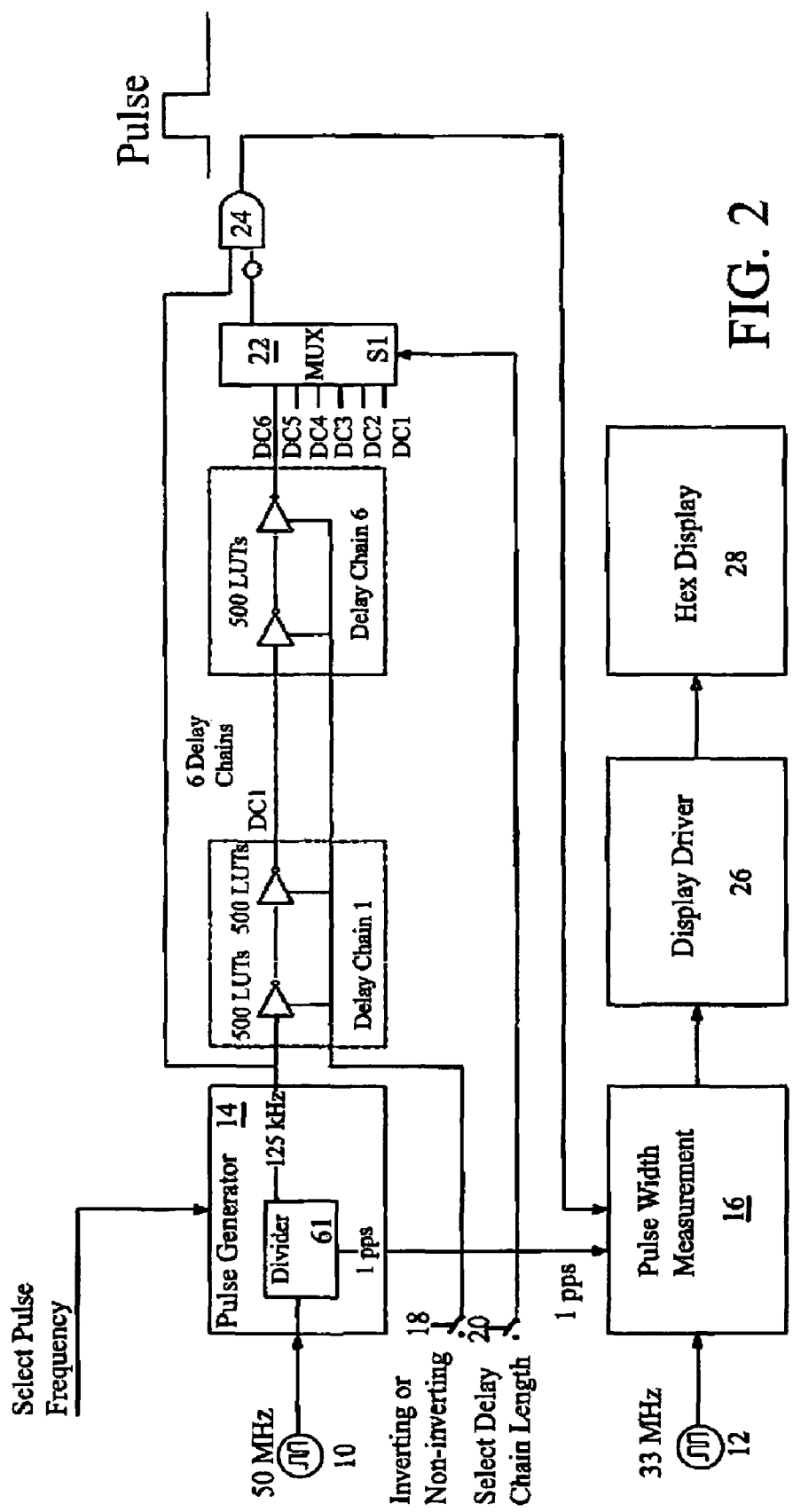
FIG. 2 is a block diagram of the circuit architecture of the present invention including major components and data paths.

FIG. 2 is a block diagram of the circuit architecture including major components and data paths. The circuit is preferably programmed onto a conventional semiconductor FPGA device to act as a performance monitor.

The illustrated circuit includes a main clock implemented by an external (off-chip) clock crystal 10 and, in accordance with the invention, an additional asynchronous clock autonomous from the main clock. The second clock is here implemented as an additional external (off-chip) clock crystal 12, which is independent and asynchronous relative, to the first. In the illustrated embodiment one clock 10 is set to 100/50 Mhz and the other is 32/33 Mhz. The 100/50 Mhz crystal 10 is used to test a majority of the FPGA logic, and its clock signal is fed into on-chip pulse generator 14.

Pulse generator 14 is preferably configured from conventional combinatorial and sequential logic circuits including a high speed logic Counter/Divider configured from the combinational and sequential circuits on the FPGA, which is programmed to operate as a pulse generator.

More specifically, the pulse generator 14 includes a counter/divider 61 that divides the frequency (here 50 Mhz)

from clock 10 down by a controllable factor that depends on setup switches on the board. The pulse generator 14 is programmed to produce two synchronous outputs: 1) a 1 pulse-per-second clock which is fed into a pulse width measurement block 16; and 2) a nominal 125 KHz pulse train.

Pulse width measurement block 16 is likewise preferably configured from combinatorial logic on the FPGA, which is programmed to measure an output pulse width (to be described) by sampling at the 1 pulse-per-second clock rate.

The nominal 125 KHz pulse train is fed into a set of LUTs resident on the existing semiconductor FPGA device for propagation through the delay chain to be measured. The LUTs (lookuptables) are the universal logic gates that implement the combinational logic on the FPGA. They are programmed to be inverters or buffers depending on the position of a switch 18 on the FPGA board.

A multiplexer (MUX) 22 following the LUTs allows selection of the length of the delay chain to be tested. The MUX 22 allows selection of various size delay chains, which verifies the delay measurements. In the present embodiment the MUX 22 is programmed (from unused LUTs) as a 6-to-1 multiplexer which selects up to six separate taps on the delay chain. The LUTs under test are grouped into interconnected groups of 500 by pre-programming the FPGA input/output blocks (IOBs). Each multiplexer 22 input (DC1-DC6) is connected to the output of one group of 500 LUTs under test. Thus, up to six groups of 500 LUTs, or 3000 LUTs total, may be included in the delay chain to be tested. Of course, this number may vary depending on the size and number of inputs of the MUX 22. The selector input S1 comprises a binary bit value sufficient to control the given number of selector inputs, and to control six inputs DC1-DC6 a three bit selector input S1 is required from switch 20. This way, switch 20 determines whether one, two, three, or up to all six groups of LUTs (anywhere from 500-3000) are included in the delay chain to be tested.

A logic AND gate 24 has one inverted input connected as shown to the output of the MUX 22 and another input connected to the 125 KHz pulse train of pulse generator 14. Thus, the output of logic gate 24 is a pulse train (shown) with pulses that are shorter than the 125 KHz pulse train of pulse generator 14. This is because the ANDing effectively limits the pulse width of the 125 KHz pulse train to the propagation delay time through the selected delay chain under test. Consequently, the width of this illustrated shortened pulse equals the delay through the LUTs. The output of the logic gate 24 is connected back around into the pulse width measurement block 16 and thereby feeds the shortened pulse into the pulse width measurement block 16 for measurement.

Figure 3:
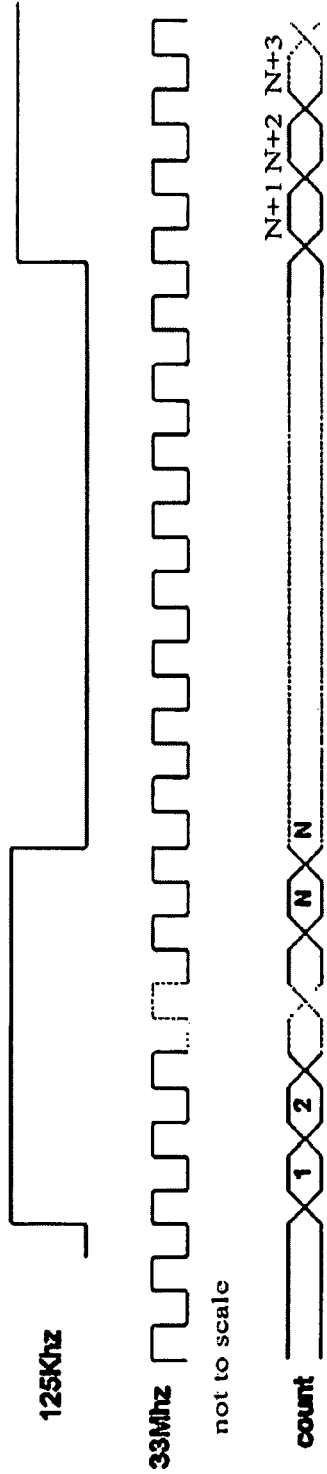
FIG. 3 is a timing diagram illustrating the operation of the pulse width measurement of the present invention.

FIG. 3 is a timing diagram illustrating the operation of the pulse width measurement 16 of the present invention. At top the output pulse from AND gate 24 appears and this is a 125 KHz pulse train with pulse width equal to the delay through the delay chain. The 32/33 Mhz clock 12 appears at center. As shown at bottom, the top output pulse from AND gate 24 is sampled by the 32/33 Mhz clock 12 for a fixed period of, for example, one second. This is done by the pulse width measurement block 16. The pulse width measurement block 16 then counts the sampled pulse train to determine the pulse width, and this is output to a hexadecimal display 28 (driven by a display driver 26). The visual readout from the display 28 is thereby updated continuously to display the propagation delay through the delay chain.

Figure 4:
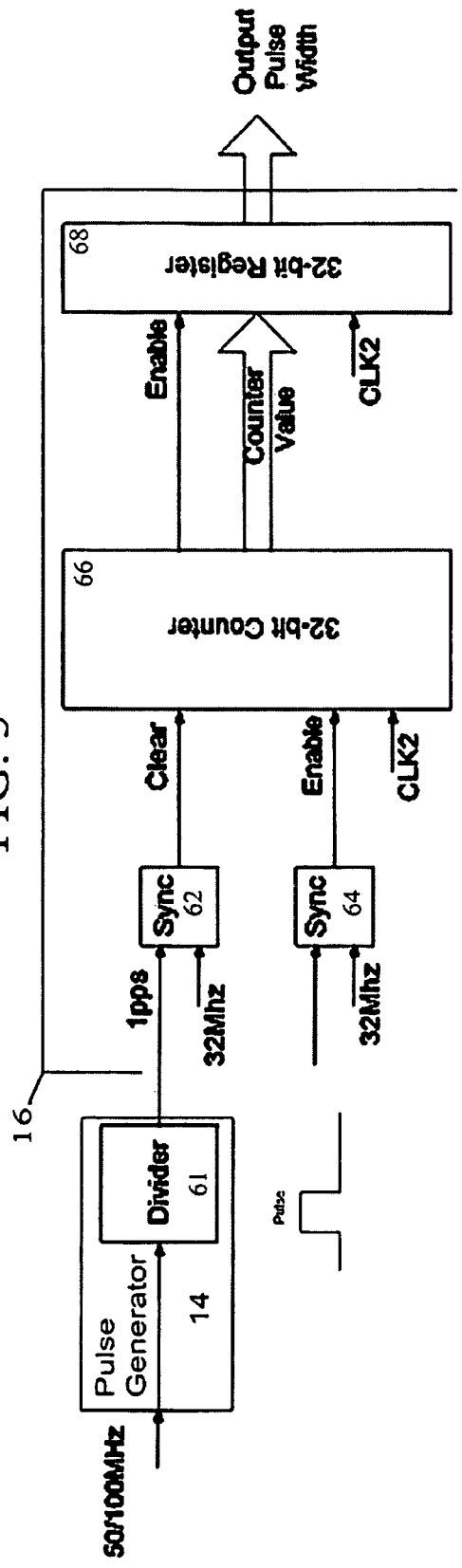
FIG. 4 is a more detailed block diagram of the pulse width measurement block configured from an unused delay chain on the FPGA.

FIG. 4 is a more detailed block diagram of the pulse width measurement block 16, which again is preferably configured from combinatorial and sequential logic on the FPGA programmed to measure the output pulse width by sampling at the 1 pulse-per-second clock rate. The pulse generator 14 is also shown to the extent that the 1 pps clock from counter/divider 61 is used. The pulse width measurement block 16 is essentially another counter circuit comprising two synchronization circuits 62, 64, a 32-bit counter 66 that counts the sampled pulse train, and a 32-bit register to hold the count. More specifically, the 1 pps clock from counter/divider 61 is input to a 1 pps/32 Mhz synchronization circuit 62, which synchronizes the 1 pps clock with the 32/33 Mhz clock 12 (see FIG. 2). The 1 pps/32 Mhz synchronization circuit 62 is in turn connected to the clear input of a 32-bit counter 66. The sampled pulse train from FIG. 3 (bottom) is likewise input to a 1 pps/32 Mhz synchronization circuit 64, which is in turn connected to the enable input of the 32-bit counter 66.

In order to give correct counter values, the counter 66 cannot have any asynchronous inputs. The two synchronization circuits 62, 64 serve to re-synchronize the inputs to the counter 66 to avoid this problem. There are a variety of existing circuits that will suffice for the two synchronization circuits 62, 64, including a two stage synchronizer.

The counter 66 count value is fed to a 32-bit shift register 68 which records the number of times the pulse is 'high' during the 1-second sampling interval. At the end of the 1 second time interval the value of the counter 66 is transferred to shift register 68, and the counter 66 is cleared.

It is noteworthy that the above-described circuit uses an additional asynchronous clock 12 autonomous from the main clock 10 and which operates autonomously therefrom. An individual pulse could only measured to an accuracy of 30 ns, but with two clocks there are 125000 pulses measured with different sampling points every time. The resulting accuracy is better than 0.25 ps. The key to the accuracy here is the use of the additional asynchronous clock. An additional sampling accuracy of the 1 pps second clock reduces the measurement accuracy to 30 ns, but this is averaged over 125K pulses, so it contributes only an additional 0.25 ps of error per pulse, and so the resulting accuracy is better than 0.25 ps.

Referring back to FIG. 2, the output from the 32-bit shift register 68 may be converted to a hex value using state machines, lookup tables, etc. The final two blocks in FIG. 2 take the value in the shift register 68 of FIG. 4 and convert it to a form which can be displayed. A display driver 26 is connected to a multidigit hex display 28 to continuously display the value.

For verification, the pulse generated in the internal logic through the delay chain may also be output off chip for corroboration of the pulse width on an external oscilloscope.

It should now be apparent that the above-described architecture and method provide a built-in self-test (BIST) for FPGA delay propagation using available (unused) FPGA resources, that eliminates input and output delays and provides far greater accuracy.

Having now fully set forth the preferred embodiment and certain modifications of the concept underlying the present invention, various other embodiments as well as certain variations and modifications of the embodiments herein shown and described will obviously occur to those skilled in the art upon becoming familiar with said underlying concept. It is to be understood, therefore, that the invention may be practiced otherwise than as specifically set forth in the appended claims.

What is claimed is:

1. A circuit architecture for built-in self-test (BIST) of propagation delay along a delay chain of an FPGA chip, comprising:

a pulse generator embedded on said FPGA chip and configured to generate an output pulse train at a first frequency, said output pulse train being input to the delay chain of the FPGA chip;

a logic gate connected to an output of said delay chain and to said pulse generator for modulating a pulse width of said output pulse train to equal a propagation delay of said output pulse train through said delay chain; and, a pulse width measurement circuit embedded on said FPGA chip and configured to measure the modulated pulse width from said logic gate.

2. The circuit architecture according to claim 1, wherein said pulse width measurement circuit comprises two independent asynchronous clocks.

3. The circuit architecture according to claim 1, wherein a length of the delay chain of the FPGA chip is user-selectable.

4. The circuit architecture according to claim 3, further comprising a multiplexer for allowing user-selection of a length of the delay chain of the FPGA chip.

5. The circuit architecture according to claim 1, wherein said pulse width measurement circuit further comprises a counter and shift register.

6. A method for a built-in self-test (BIST) of FPGA propagation delay, comprising the steps of:

embedding a pulse generator on an FPGA chip having a delay chain;

embedding a pulse width measurement circuit on said FPGA chip;

generating a test pulse train with said pulse generator at a first frequency and inputting said test pulse train to a delay chain under test on the FPGA chip;

performing a logical operation on a pulse train output from said delay chain under test and said test pulse train to provide a pulse width modulated train with pulse width equal to a propagation delay of said test pulse train through said delay chain under test;

measuring a modulated pulse width at said pulse width measurement circuit.

7. The method according to claim 6, further comprising the step of providing a digital display of said measured pulse width using an on-chip display driver.

8. A method for built-in self-test (BIST) of FPGA delay chain faults, comprising the steps of:

incorporating an on-chip pulse generator and on-chip pulse width measurement circuit on an FPGA chip having a look up table (LUT) delay chain to be tested;

generating a pulse at said pulse generator and inputting said pulse to said LUT delay chain;

measuring a duration of said generated pulse through said LUT delay chain using said on-chip pulse measurement circuit;

determining a delay through the LUT delay chain under test from said measured duration.

9. The method according to claim 8, wherein said input puke is generated on-chip.

10. The method according to claim 9, wherein said step of incorporating an on-chip pulse width measurement circuit comprises incorporating an on-chip pulse width measurement circuit having two independent asynchronous clocks.

11. The method according to claim 8, wherein said step of determining a delay through the LUT delay chain comprises converting the pulse width of an output pulse to a hex value and displaying the hex value on a display.

12. A circuit for built-in self-test (BIST) of propagation delay along a delay chain of an FPGA chip, comprising:

a pulse generator embedded on said FPGA chip;

a logic gate connected to an output of said delay chain and to said pulse generator; and a pulse width measurement circuit embedded on said FPGA chip further comprising two independent asynchronous clocks.

13. The circuit according to claim 12, further comprising a multiplexer for allowing user-selection of a length of the delay chain to be tested.

14. The circuit according to claim 12, wherein said pulse width measurement circuit further comprises a counter and shift register.

* * * * *